(12) United States Patent
Yin et al.

(10) Patent No.: US 8,772,127 B2
(45) Date of Patent: *Jul. 8, 2014

(54) SEMICONDUCTOR DEVICE AND METHOD FOR MANUFACTURING THE SAME

(75) Inventors: Haizhou Yin, Poughkeepsie, NY (US); Huicai Zhong, Beijing (CN); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 70 days.

This patent is subject to a terminal disclaimer.

(21) Appl. No.: 13/142,591

(22) PCT Filed: Jan. 27, 2011

(86) PCT No.: PCT/CN2011/070694
§ 371 (c)(1),
(2), (4) Date: Jun. 28, 2011

(87) PCT Pub. No.: WO2012/088778
PCT Pub. Date: Jul. 5, 2012

(65) Prior Publication Data
US 2012/0168881 A1 Jul. 5, 2012

(30) Foreign Application Priority Data
Dec. 29, 2010 (CN) .......................... 2010 1 0612577

(51) Int. Cl.
*H01L 29/772* (2006.01)
(52) U.S. Cl.
USPC .... 438/424; 438/618; 438/675; 257/E21.546; 257/E21.642
(58) Field of Classification Search
USPC .......... 438/424, 618, 675, 740; 257/E21.546, 257/E21.642
See application file for complete search history.

(56) References Cited

U.S. PATENT DOCUMENTS 6,828,211 B2 * 12/2004 Chi .............................. 438/424
7,381,609 B2 * 6/2008 Yang et al. .................... 438/218
(Continued)

FOREIGN PATENT DOCUMENTS

CN 1478297 2/2004
CN 1507032 6/2004
(Continued)

OTHER PUBLICATIONS

PCT International Search Report and Written Opinion of the International Searching Authority, dated Sep. 22, 2011, PCT Patent Application No. PCT/CN2011/070694, filed Jan. 27, 2011.

(Continued)

*Primary Examiner* — Julio J Maldonado
*Assistant Examiner* — Jaehwan Oh
(74) *Attorney, Agent, or Firm* — Vierra Magen Marcus LLP

(57) ABSTRACT

The present invention provides a semiconductor device and a method for manufacturing the same. The method for manufacturing the semiconductor device comprises: providing a silicon substrate having a gate stack structure formed thereon and having {100} crystal indices; forming an interlayer dielectric layer coving a top surface of the silicon substrate; forming a first trench in the interlayer dielectric layer and/or in the gate stack structure, the first trench having an extension direction being along <110> crystal direction and perpendicular to that of the gate stack structure; and filling the first trench with a first dielectric layer, wherein the first dielectric layer is a tensile stress dielectric layer. The present invention introduces a tensile stress in the transverse direction of a channel region by using a simple process, which improves the response speed and performance of semiconductor devices.

16 Claims, 7 Drawing Sheets

(56) References Cited

U.S. PATENT DOCUMENTS

| | | | |
|---|---|---|---|
| 7,605,442 B2 * | 10/2009 | Fujii et al. | 257/510 |
| 8,198,170 B2 * | 6/2012 | Ng et al. | 438/426 |
| 8,232,178 B2 * | 7/2012 | Yin et al. | 438/424 |
| 8,530,328 B1 * | 9/2013 | Yin et al. | 438/424 |
| 2002/0063292 A1 * | 5/2002 | Armstrong et al. | 257/367 |
| 2004/0113174 A1 | 6/2004 | Chidambarrao | |
| 2005/0280051 A1 * | 12/2005 | Chidambarrao et al. | 257/274 |
| 2009/0014806 A1 * | 1/2009 | Ostermayr et al. | 257/369 |
| 2009/0230439 A1 * | 9/2009 | Wang et al. | 257/288 |
| 2011/0049640 A1 * | 3/2011 | Feustel et al. | 257/369 |
| 2012/0070948 A1 * | 3/2012 | Cheng et al. | 438/199 |
| 2012/0153398 A1 * | 6/2012 | Baars et al. | 257/369 |

FOREIGN PATENT DOCUMENTS

| | | |
|---|---|---|
| CN | 1956221 | 5/2007 |
| CN | 101533853 | 9/2009 |

OTHER PUBLICATIONS

English Translation of Abstract of Chinese Patent No. CN101533853.

English Translation of Abstract of Chinese Patent No. CN1956221.

* cited by examiner

SEMICONDUCTOR DEVICE AND METHOD FOR MANUFACTURING THE SAME

CROSS REFERENCE TO RELATED APPLICATIONS

This application is a Section 371 National Stage Application of International Application No. PCT/CN2011/070694, filed on Jan. 27, 2011, which claims the benefit of CN 201010612577.X, filed on Dec. 29, 2010, the entire contents of which are incorporated herein by reference in their entirety.

BACKGROUND OF THE INVENTION

1. Field of the Invention

The present invention relates to semiconductor technology, and particularly, relates to a semiconductor device and a method for manufacturing the semiconductor device.

2. Description of Related Art

In the process of manufacturing Complementary Metal-Oxide Semiconductor (CMOS), with the scaling of the critical dimension of semiconductor devices, stress is typically introduced into the channel region for improving mobility of carriers and performance of semiconductor devices.

The following table is shown by Scott E. Thompson et al. in Uniaxial-Process-Induced Strained-Si: Extending the CMOS Roadma (IEEE Transactions on Electron Devices, Vol 53, No. 5, February 2006).

| (001) silicon | <100> | | <110> | Unit: $10^{-12}$ cm$^2$/dyn |
|---|---|---|---|---|
| polarity | $\pi_\|$ | $\pi_\perp$ | $\pi_\|$ | $\pi_\perp$ |
| | $\pi_{11}$ | $\pi_{12}$ | $(\pi_{11}+\pi_{12}+\pi_{44})/2$ | $(\pi_{11}+\pi_{12}-\pi_{44})/2$ |
| n-MOSFET | −42.6/−102 | −20.7/53.4 | −35.5/−31.6 | −14.5/−17.6 |
| p-MOSFET | 9.1/6.6 | −6.2/−1.1 | 71.7/71.8 | −33.8/−66.3 |

The table shows comparison of piezoresistance coefficients between a MOSFET on a silicon chip of crystal indices (001) and bulk silicon. The piezoresistance coefficients are well known in the semiconductor technology for predicting and measuring mobility of electrons and holes. In the table, $\pi_\|$ is the piezoresistance coefficient in the longitudinal direction, and $\pi_\perp$ is the piezoresistance coefficient in the transverse direction of the channel region. As for a silicon chip having a crystal indices (001), $\pi_\|$ and $\pi_\perp$ may be expressed as functions of three fundamental cubic piezoresistance coefficients $\pi_{11}$, $\pi_{12}$ and $\pi_{44}$, respectively. The influence of piezoresistance coefficients on mobility of carriers may be expressed as: $\Delta\mu/\mu \approx |\pi_\| \sigma_\| + \pi_\perp \sigma_\perp|$, wherein $\Delta\mu/\mu$ is the fractional change in mobility, $\sigma_\|$ and $\sigma_\perp$ are longitudinal and transverse stresses of the channel region, respectively. As shown in the above table, the tensile stress in transverse direction of the channel region enhances mobility of carriers for both PMOS transistors and NMOS transistors.

However, in related art, stress is typically introduced in the longitudinal direction of the channel region, for example, by Dual Stress Liner (DSL) technology and Stress Memorization Technology (SMT), and so on.

Taking the DSL technology as an example, an NMOS transistor is covered by a tensile stress liner, and a PMOS transistor is covered by a compressive stress liner, thereby improving mobility of carriers in the NMOS transistor and PMOS transistor, respectively. Therefore, in the manufacturing process, the DSL technology requires formation of respective stress liners for different types of transistors, which is complicated. The SMT requires forming stress liners on devices firstly and then performing an annealing process to the devices, which is also complicated.

Therefore, a new type of semiconductor device is needed to solve the above problems existing in the related art, in order that stress is more sufficiently applied to MOS transistors, and performance of the MOS transistors may be improved.

SUMMARY OF THE INVENTION

An object of the present invention is to provide solutions for the problem that in the related art, the semiconductor process of applying stress on a MOS transistor is complicated.

To achieve the object, the present invention provides a method for manufacturing a semiconductor device, comprising:

providing a silicon substrate having a gate stack structure formed thereon and having {100} crystal indices;

forming an interlayer dielectric layer coving a top surface of the silicon substrate;

forming a first trench in the interlayer dielectric layer and/or in the gate stack structure, the first trench having an extension direction being along <110> crystal direction and perpendicular to that of the gate stack structure; and filling the first trench with a first dielectric layer, wherein the first dielectric layer is a tensile stress dielectric layer.

The present invention further provides a semiconductor device, comprising:

a silicon substrate having {100} crystal indices;

a gate stack structure formed on the silicon substrate;

an interlayer dielectric layer covering a top surface of the silicon substrate; and a first isolation region formed in the interlayer dielectric layer and/or in the gate stack structure, wherein the first isolation region has an extension direction being along <110> crystal direction and perpendicular to that of the gate stack structure, the first isolation region comprises a first dielectric layer, and the first dielectric layer is a tensile stress dielectric layer.

Compared with the related art, the present invention has the following advantages.

The technical solutions provided by the present invention form a first trench and fill the first trench with a tensile stress dielectric layer, so that tensile stress is applied in the transverse direction of the MOS transistor channel region whose <110> direction is along the longitudinal direction, which improves the response speed of the MOS transistor and improves performance of semiconductor devices. In addition, the present invention may be applied for both NMOS transistors and PMOS transistors, thus improving performance of a whole CMOS circuit.

Furthermore, when the semiconductor manufacturing process reaches 45 nm technology node and beyond, all gates extend in the same direction to simplify the gate lithography, in other words, channel regions of all the MOS transistors have the same longitudinal direction and transverse direction. Therefore, the solutions provided by the present invention may be widely used in 45 nm technology node and beyond. The solutions provided by the present invention have a strong industrial applicability.

DETAILED DESCRIPTION OF THE EMBODIMENTS

In the related art, stress is introduced into the channel region of a MOS transistor by the DSL, SMT and the like.

In the technical solutions provided by the present invention, a first trench is formed in an interlayer dielectric layer/gate stack structure and a tensile-stressed dielectric layer is filled into the first trench, so that tensile stress is applied to the transverse direction of the MOS transistor channel region, whose <110> direction is along the longitudinal direction, by the tensile-stressed dielectric layer, which may improve response speed of the MOS transistor and enhance performance of semiconductor devices. In addition, the present invention may be applied for both NMOS transistors and PMOS transistors, thereby improving performance of the whole CMOS circuit.

Furthermore, when the semiconductor manufacturing process reaches 45 nm technology node and beyond, all gates extend in the same direction to simplify the gate lithography. In other words, channel regions of all the MOS transistors have the same longitudinal direction and transverse direction. Therefore, the solutions provided by the present invention may be widely used in 45 nm technology node and beyond. Therefore, the solutions provided by the present invention have wide industrial applications.

Hereafter, the present invention will be described in detail with reference to embodiments in conjunction with the accompanying drawings.

Although the present invention has been disclosed hereinafter with reference to preferred embodiments in detail, the present invention may be implemented in other different embodiments. The present invention may be generalized by a person of ordinary skill in the art without departing from the spirit thereof. Therefore, the present invention should not be limited to the embodiments disclosed here.

Figure 1:
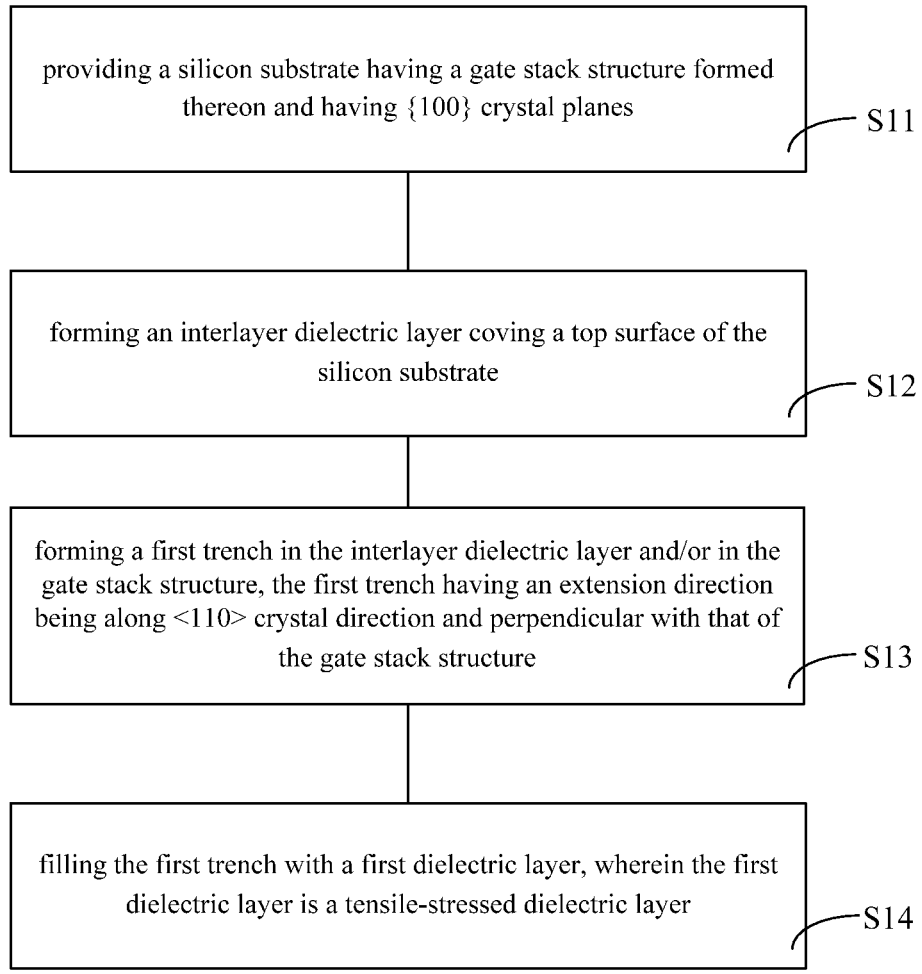
FIG. 1 is a flow chart of a method for manufacturing a semiconductor device in an embodiment.

Referring to FIG. 1, the method for manufacturing a semiconductor device in the embodiment comprises:

Step S11: providing a silicon substrate with a gate stack structure formed thereon, wherein the silicon substrate has {100} crystal indices;

Step S12: forming an interlayer dielectric layer to cover a top surface of the silicon substrate;

Step S13: forming a first trench in the interlayer dielectric layer and/or in the gate stack structure, wherein the first trench has an extension direction along <110> crystal direction and perpendicular to that of the gate stack structure;

Step S14: filling the first trench with a first dielectric layer, wherein the first dielectric layer is a tensile-stressed dielectric layer.

Hereafter, the present invention will be described in detail in conjunction with FIG. 1 and FIGS. 2a-6c.

Referring to FIG. 1 and FIGS. 2a-2c, the step S11 is performed to provide a silicon substrate 10 with a gate stack structure 13 formed thereon, and the silicon substrate 10 has {100} crystal indices.

Figure 2A:
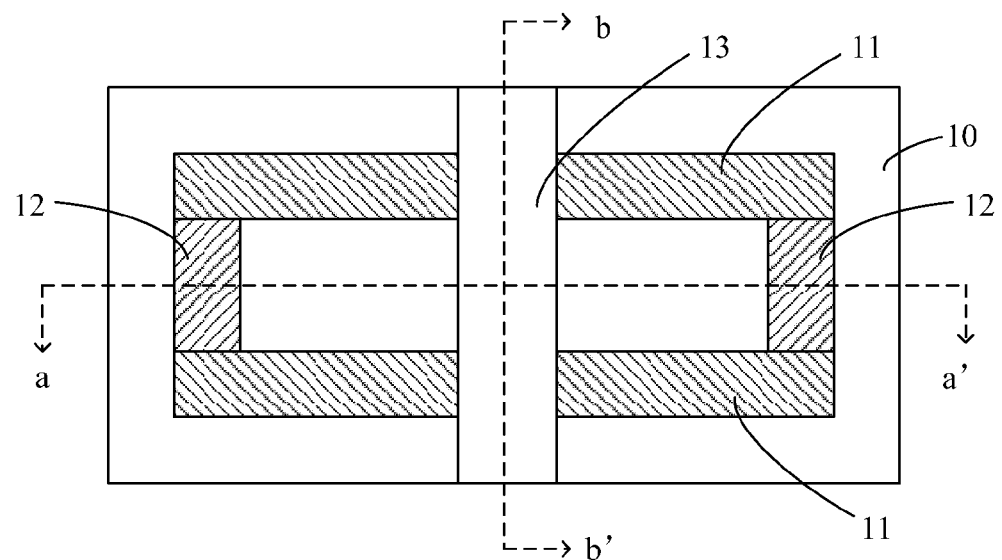
FIGS. 2a-6c are cross-sectional views and top views of intermediate structures of a semiconductor device in a method for manufacturing the semiconductor device according to the embodiment of the present invention.
Figure 2B:
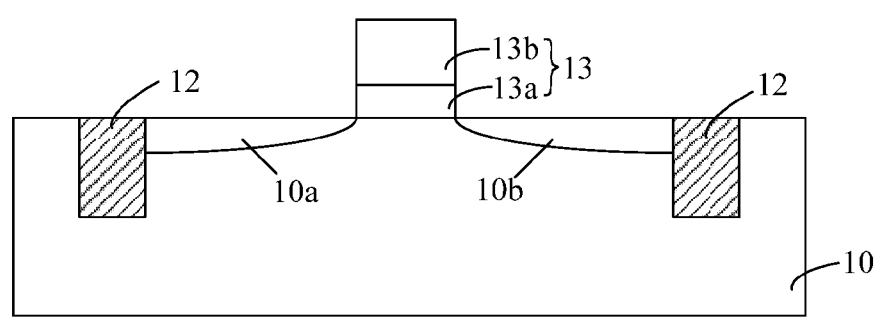
Figure 2C:
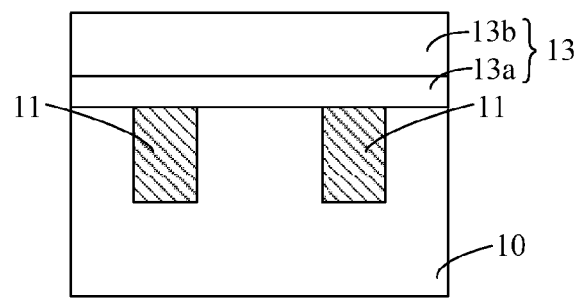

Referring to FIGS. 2a-2c, FIG. 2a is a top view for the silicon substrate 10, FIG. 2b is a cross-sectional view along the direction a-a' in FIG. 2a, and FIG. 2c is a cross-sectional view along the direction b-b' in FIG. 2a. Optionally, the silicon substrate 10 has {100} crystal indices according to the embodiment, in other words, the crystal indices of the silicon substrate 10 belong to the {100} family. A gate stack structure 13 is formed on the silicon substrate 10. The gate stack structure 13 may be cut or not cut yet.

The gate stack structure 13 in the embodiment comprises a gate dielectric layer 13a and a gate electrode 13b thereon. A source region 10a and a drain region 10b are formed within the silicon substrate 10 and on both sides of the gate stack structure 13 (the source and drain regions 10a and 10b further comprise source/drain extension regions, such as LDD). In other embodiments, the gate stack structure 13 further comprises a dummy gate electrode formed in the gate-last process. The longitudinal direction of the channel region of the MOS transistor which comprises the gate stack structure 13 is along <110> crystal direction, that is to say, the longitudinal direction belongs to the <110> family. As an unlimited example, the longitudinal direction in the present embodiment is along [110] crystal direction. Correspondingly, the extension direction of the gate stack structure 13 is perpendicular to the [110] crystal direction.

In the embodiment, a second trench and a third trench may be formed in the silicon substrate in advance. The second trench has an extension direction parallel with the longitudinal direction of the channel region of the MOS transistor, namely, the [110] crystal direction. The third trench has an extension direction perpendicular to that of the second trench. The MOS transistor is formed on portions of the silicon substrate 10 surrounded by the second trench and the third trench. The second trench is filled with a second dielectric layer (for forming a second isolation region 11). The third trench is filled with a third dielectric layer (for forming a third isolation region 12). The substrate may be designed to have at least two second trenches and third trenches as appropriate. In the embodiment, the numbers of the second trench and the third trench are both two. Only one MOS transistor is formed in the region surrounded by the second trench and the third trench.

The second dielectric layer in the embodiment may be a tensile-stressed dielectric layer, for example, a tensile-stressed silicon nitride layer, a tensile-stressed silicon oxide layer, a tensile-stressed silicon oxynitride layer, or any combination thereof. Optionally, the second dielectric layer has a tensile stress of at least 1 GPa. The third dielectric layer in the embodiment is a low-stressed dielectric layer, for example, a low-stressed silicon nitride layer, a low-stressed silicon oxide layer, a low-stressed silicon oxynitride, or any combination thereof. Optionally, the third dielectric layer has a stress not more than 180 MPa. In the specification, the silicon oxide layer may further comprise doped silicon oxide layer, for example, PSG, BSG, BPSG, FSG, and so on. The silicon nitride layer may further comprise doped silicon nitride layer, for example, carbon doped silicon nitride, and so on. The silicon oxynitride layer may further comprise doped silicon oxynitride layer, for example, carbon doped silicon oxynitride, and so on.

The tensile-stressed second dielectric layer may apply a tensile stress in the transverse direction of the channel region of the MOS transistor, which not only improves performance of an NMOS transistor, but also improves performance of a PMOS transistor, thereby improving performance of the whole CMOS circuit.

Referring to FIG. 1 and FIGS. 3a-3c, the step S12 is performed to form an interlayer dielectric layer 14 so as to cover a top surface of the silicon substrate 10.

Figure 3A:
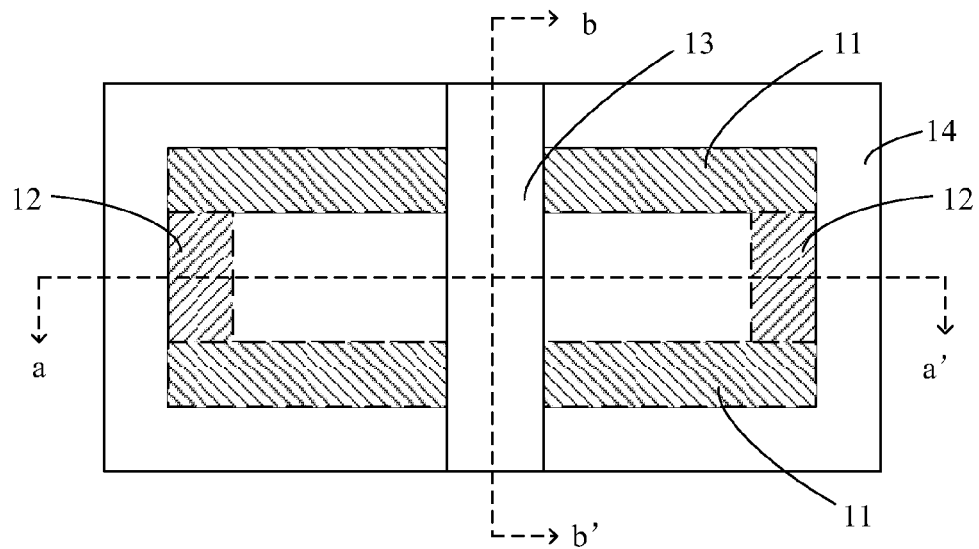
Figure 3B:
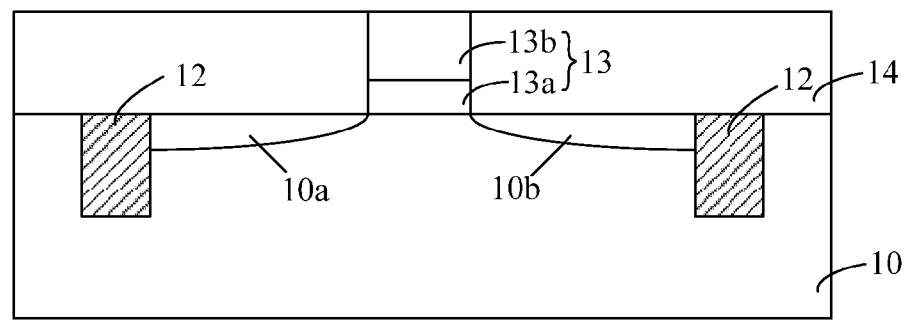
Figure 3C:
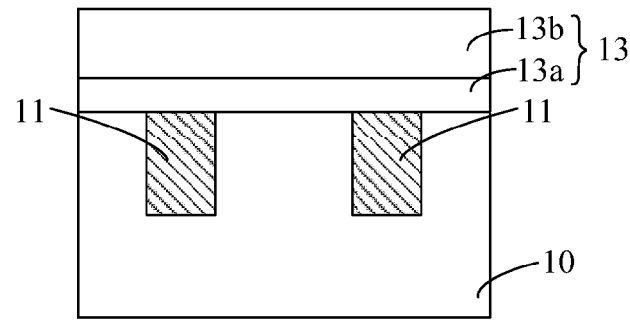

Referring to FIGS. 3a-3c, FIG. 3a is a top view after the interlayer dielectric layer 14 is formed, FIG. 3b is a cross-sectional view along the direction a-a' in FIG. 3a, and FIG. 3c is a cross-sectional view along the direction b-b' in FIG. 3a. In order to illustrate the embodiment, the second dielectric layer in the second trench and the third dielectric layer in the third trench both under the interlayer dielectric layer 14 are represented by broken lines in the perspective view of FIG. 3a. The interlayer dielectric layer 14 may be made of silicon oxide or doped silica glass, such as BSG, PSG, and so on, or other materials for interlayer dielectric layers known to a person skilled in the art. The interlayer dielectric layer 14 may be formed by the CVD method or other methods known to a person skilled in the art. After the interlayer dielectric layer 14 is formed, planarization is performed so that the top surface of the interlayer dielectric layer 14 is flushed with that of the gate stack structure 13. The planarization may be performed by the CMP method.

Figure 4A:
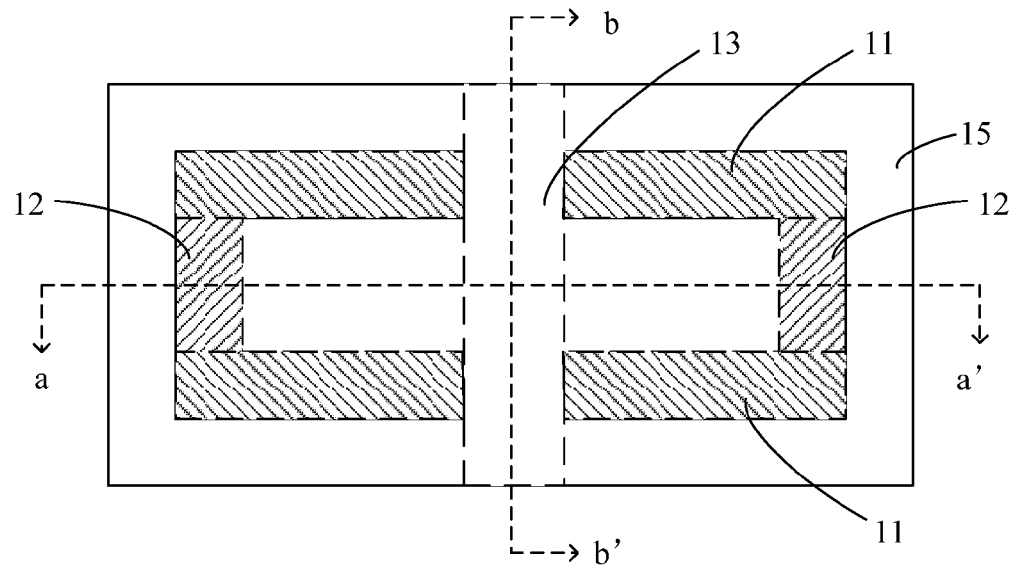
Figure 4B:
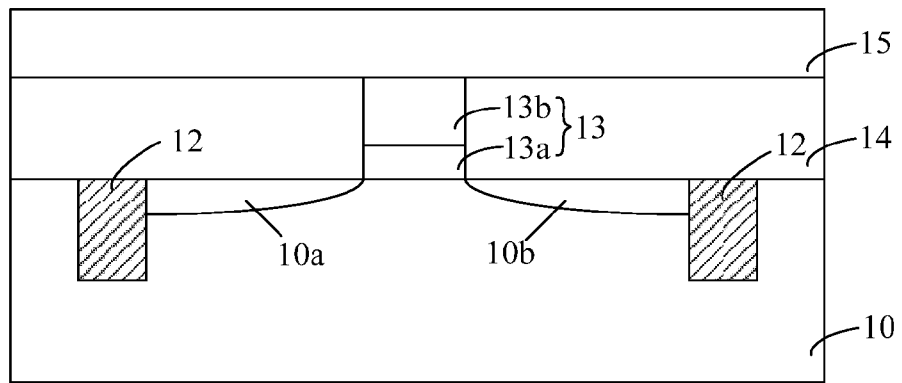
Figure 4C:
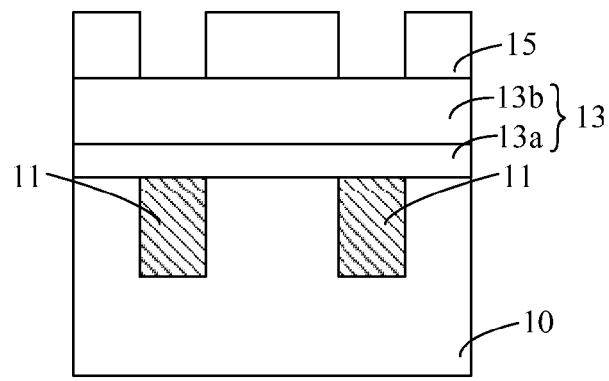
Figure 5A:
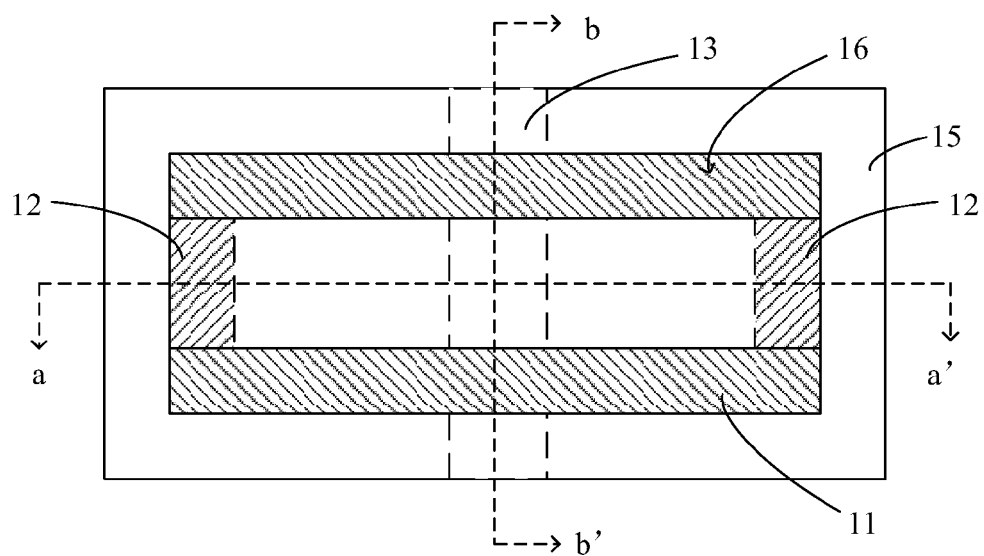
Figure 5B:
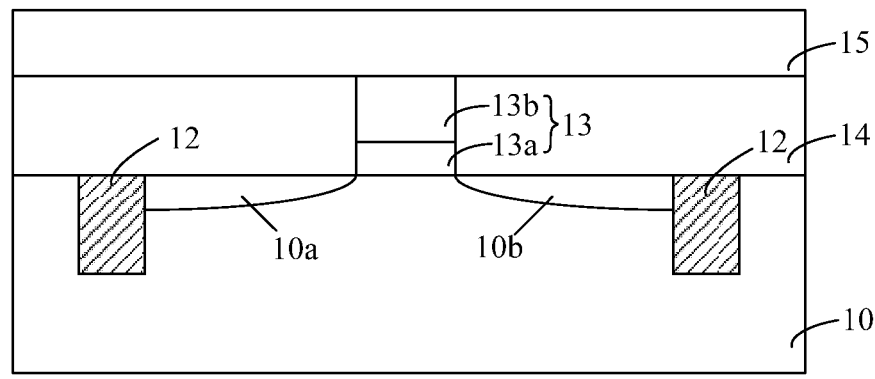
Figure 5C:
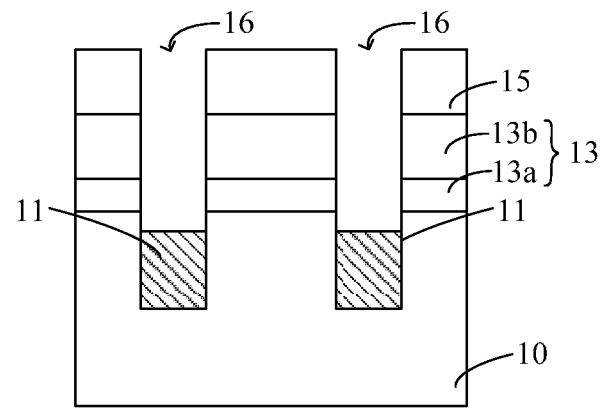

Referring to FIG. 1 and FIGS. 4a-5c, the step S13 is performed to form a first trench 16 in the interlayer dielectric layer 14 and/or in the gate stack structure 13. The first trench 16 has an extension direction perpendicular to that of the gate stack structure 13. FIG. 4a is a top view after a photoresist layer 15 is formed and patterned on the interlayer dielectric layer 14 and the gate stack structure 13, FIG. 4b is a cross-sectional view along the direction a-a' in FIG. 4a, and FIG. 4c is a cross-sectional view along the direction b-b' in FIG. 4a. FIG. 5a is a top view after the first trench 16 is formed, FIG. 5b is a cross-sectional view along the direction a-a' in FIG. 5a, and FIG. 5c is a cross-sectional view along the direction b-b' in FIG. 5a. Similarly, perspective effect is represented by broken lines in FIG. 4a and FIG. 5a.

Firstly, referring to FIGS. 4a-4c, the photoresist layer 15 is formed to cover the surfaces of the interlayer dielectric layer 14 and the gate stack structure 13, and then the photoresist layer 15 is patterned to define patterns of the first trench. The method for forming the photoresist layer 15 may be spin-coating, spraying, etc., and the method for patterning the photoresist layer 15 comprises exposure, developing, fixing, etc.

Referring to FIGS. 5a-5c, specifically, with the patterned photoresist layer 15 as a mask, an etching process is performed to the interlayer dielectric layer 14 and the gate stack structure 13 to form the first trenches 16. The first trenches 16 are formed above (and on) the second isolation regions 11. The second dielectric layer is exposed at bottom of the first trenches 16. Preferably, while performing the etching process to form the first trenches 16, the upper portions of the second dielectric layer are also etched so that the top surface of the second dielectric layer is lower than that of the silicon substrate 10. Of course, in other embodiments, the etching process may be performed until the top surface of the second dielectric layer is exposed such that the second dielectric layer is not etched. The etching process may be performed by dry etching, wet etching, etc. After the first trenches are formed, the patterned photoresist layer 15 is removed by ashing or other methods.

The first trench 16 has a width equal to or bigger or smaller than that of the second isolation region 11. In the embodiment, the first trench 16 has the same width as that of the second trench. Therefore, the same mask plate may be used when patterning the photoresist layer 15 and forming the second trench 16, which simplifies the process and reduces the cost.

In the embodiment, the first trench 16 is formed above the second isolation region 11 and is parallel to the extension direction of the second isolation region 11, i.e., perpendicular to that of the gate stack structure 13. Because the gate stack structure 13 extends to cover the second dielectric layer, both the interlayer dielectric layer 14 and the gate stack structure 13 are etched in the formation of the first trench 16. In other embodiment, only one of the interlayer dielectric layer 14 and the gate stack structure 13 may be etched.

Referring to FIG. 1 and FIGS. 6a-6c, the step S14 is performed to fill the first trench with a first dielectric layer 17. The first dielectric layer 17 is a tensile-stressed dielectric layer.

Figure 6A:
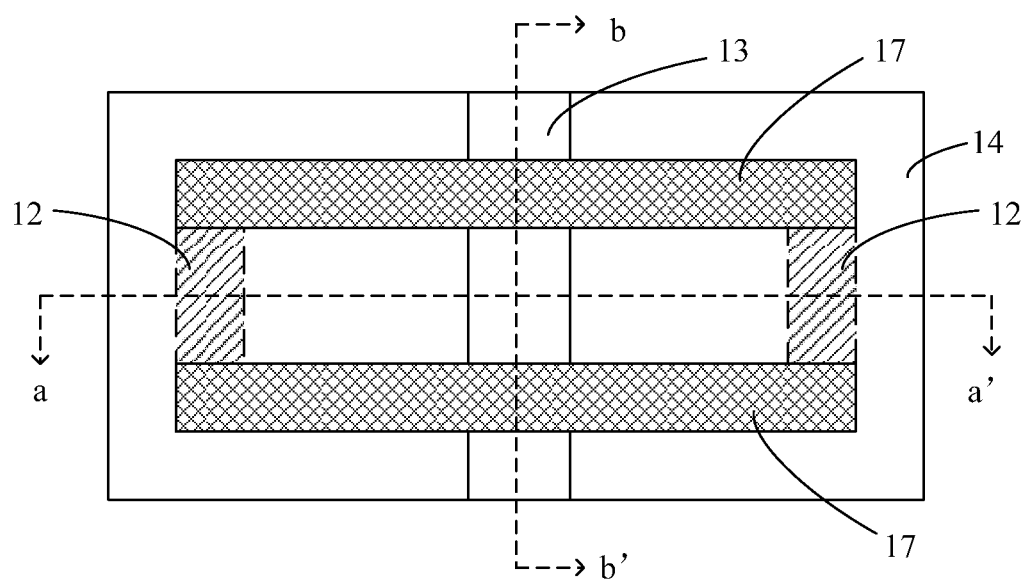
Figure 6B:
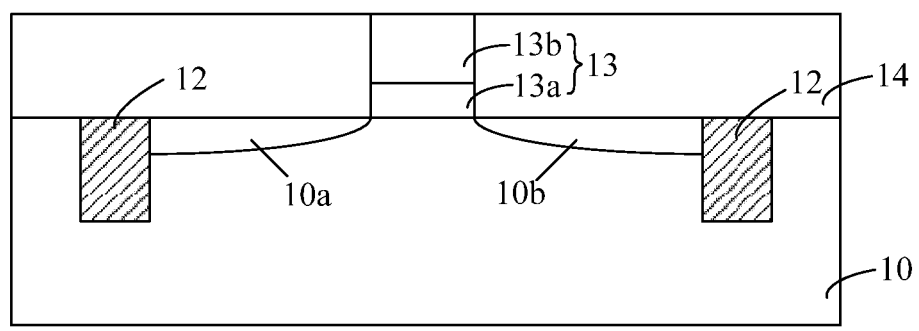
Figure 6C:
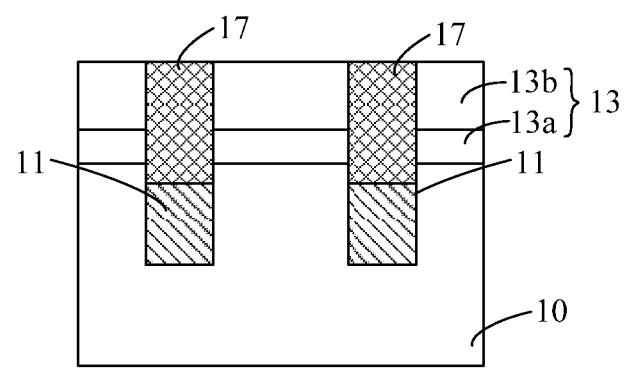

Referring to FIGS. 6a-6c, FIG. 6a is a top view corresponding to the step S14, FIG. 6b is a cross-sectional view along the direction a-a' in FIG. 6a, and FIG. 6c is a cross-sectional view along the direction b-b' in FIG. 6a. Similarly, perspective effect is used in FIG. 6a by using broken lines. The first dielectric layer 17 is a tensile-stressed dielectric layer and is made of one of silicon nitride, silicon oxide and silicon oxynitride, or any combination thereof. The first dielectric layer 17 may be formed by the PECVD method. The type and magnitude for the stress of the first dielectric layer 17 may be adjusted by controlling parameters such as the plasma power in the deposition process. Preferably, the first dielectric layer 17 has a tensile stress of at least 1 GPa. In addition, the first dielectric layer 17 may be formed by other materials and methods known to a person skilled in the art, as long as the first dielectric layer 17 is formed as a tensile-stressed dielectric layer.

The first dielectric layer 17 provides tensile stress in the transverse direction of the MOS transistor channel region whose <110> direction is along the longitudinal direction, which may improve performance of both NMOS transistors and PMOS transistors, and thereby may improve performance of the whole CMOS circuit. Furthermore, it facilitates industrial application.

In the embodiment, because the upper portion of the second dielectric layer is etched away while forming the first trench, the first dielectric layer 17 extends downwards into the second isolation region 11. In other words, the first dielectric layer 17 is embedded into the silicon substrate 10 directly or indirectly, which enhances the tensile stress applied by the first dielectric layer 17 to the silicon substrate 10, thereby further improving performance of the MOS transistor.

It should be noted that if the gate stack structure 13 is a dummy gate formed in the gate-last process, an annealing process is performed after the first dielectric layer 17 is formed in order to memorize the tensile stress in the silicon substrate 10 (including the channel region of the MOS transistor) provided by the first dielectric layer 17, and then the dummy gate is removed to form a gate dielectric layer and a gate electrode.

In the following process, contact holes and vias are formed in the interlayer dielectric layer 14 for forming the upper metal interconnecting structure.

Up to now, the MOS transistor fabricated in the embodiment is shown in FIGS. 6a-6c, comprising: the silicon substrate 10 having {100} crystal indices; the gate stack structure 13 formed on the silicon substrate 10, wherein the source region 10a and the drain region 10b are formed within the portions of the silicon substrate 10 at both sides of the gate stack structure 13; the interlayer dielectric layer 14 covering the top surface of the silicon substrate 10; the first isolation region formed in the interlayer dielectric layer 14 and/or in the gate stack structure 13, wherein the first isolation region has an extension direction along the <110> crystal direction and perpendicular to the extension direction of the gate stack structure 13, and the first isolation region comprises the first dielectric layer 17 which is a tensile-stressed dielectric layer.

In addition, the second isolation region 11 and the third isolation region 12 are formed in the silicon substrate 10. The second isolation region 11 has an extension direction parallel to that of the first isolation region direction. The third isolation region 12 has an extension direction perpendicular to that of the second isolation region 11. The MOS transistor comprising the gate stack structure 13 is formed on the region of the silicon substrate 10 surrounded by the second isolation region 11 and the third isolation region 12. The second isolation region 11 comprises the second dielectric layer, and the third isolation region 12 comprises the third dielectric layer. The first isolation region is formed above the second isolation region 11, and the second dielectric layer 11 is exposed at bottom of the first isolation region. Optionally, the second dielectric layer 11 is a tensile-stressed dielectric layer, and the third dielectric layer 13 is a low-stressed dielectric layer. Preferably, the first isolation region extends downwards into the upper portion of the second dielectric layer 11, namely, the top surface of the second dielectric layer 11 is lower than that of the silicon substrate 10. In other embodiments, the first isolation region may not extend downwards, namely, the top surface of the second dielectric layer 11 is flushed with that of the silicon substrate 10.

Although the present invention has been disclosed as above with reference to preferred embodiments, it is not intended to limit the present invention. Those skilled in the art may modify and vary the embodiments by the disclosed method without departing from the spirit and scope of the present invention. Accordingly, any alternation, change, modification and their equivalents to the embodiments according to the disclosure without departing from the spirit of the present invention may fall within the scope as defined in the appended claims.

What is claimed is:

1. A method for manufacturing a semiconductor device, comprising:
    providing a silicon substrate having {100} crystal indices with a gate stack structure formed thereon;
    forming a second isolation region within the silicon substrate wherein the second isolation region comprises a second dielectric layer;
    forming an interlayer dielectric layer to cover a top surface of the silicon substrate;
    forming a first trench in the interlayer dielectric layer and/or in the gate stack structure above the second isolation region, and the second dielectric layer is exposed at a bottom of the first trench, wherein the first trench has an extension direction being along <110> crystal direction and perpendicular to that of the gate stack structure; and
    filling the first trench with a first dielectric layer, wherein the first dielectric layer is a tensile-stressed dielectric layer.

2. The method for manufacturing a semiconductor device of claim 1, wherein the first dielectric layer is a tensile-stressed dielectric layer made of at least one of silicon nitride, silicon oxide and silicon oxynitride.

3. The method for manufacturing a semiconductor device of claim 1, wherein the first dielectric layer has a tensile stress of at least 1 GPa.

4. The method for manufacturing a semiconductor device of claim 1, wherein the gate stack structure comprises a gate electrode or a dummy gate electrode.

5. The method for manufacturing a semiconductor device of claim 4, wherein if the gate stack structure is a dummy gate electrode, the method further comprises: performing an annealing process after the first dielectric layer is formed in order to memorize the tensile stress provided by the first dielectric layer in the silicon substrate.

6. The method for manufacturing a semiconductor device of claim 1, further comprising: forming a third isolation region in the silicon substrate, wherein the third isolation region has an extension direction perpendicular to that of the second isolation region, and wherein a MOS transistor comprising the gate stack structure is formed on the area of the silicon substrate surrounded by the second isolation region and the third isolation region, the third isolation region comprises a third dielectric layer.

7. The method for manufacturing a semiconductor device of claim 1, wherein the second dielectric layer is a tensile-stressed dielectric layer.

8. The method for manufacturing a semiconductor device of claim 7, wherein the second dielectric layer is a tensile-stressed dielectric layer made of at least one of silicon nitride, silicon oxide and silicon oxynitride.

9. The method for manufacturing a semiconductor device of claim 7, wherein the second dielectric layer has a tensile stress of at least 1 GPa.

10. The method for manufacturing a semiconductor device of claim 6, wherein the third dielectric layer is a low-stressed dielectric layer.

11. The method for manufacturing a semiconductor device of claim 10, wherein the third dielectric layer is a low-stressed dielectric layer made of at least one of silicon nitride, silicon oxide and silicon oxynitride.

12. The method for manufacturing a semiconductor device of claim 10, wherein the third dielectric layer has a stress of not more than 180 MPa.

13. The method for manufacturing a semiconductor device of claim 1 further comprises a top surface of the second dielectric layer is lower than the top surface of the silicon substrate, and the first dielectric layer extends into the silicon substrate.

14. The method for manufacturing a semiconductor device of claim 6 further comprises a top surface of the third dielectric layer is lower than the top surface of the silicon substrate, and the first dielectric layer extends into the silicon substrate.

15. The method for manufacturing a semiconductor device of claim 1 further comprises the second isolation region has an extension direction along the <110> crystal direction and perpendicular to the extension direction of the gate stack structure.

16. The method for manufacturing a semiconductor device of claim 6 further comprises the second isolation region has an extension direction along the <110> crystal direction and perpendicular to the extension direction of the gate stack structure.

* * * * *